United States Patent
Yu et al.

(10) Patent No.: US 10,036,789 B2
(45) Date of Patent: Jul. 31, 2018

(54) MULTI-CHANNEL SWITCHING SYSTEM FOR MRI MATRIX GRADIENT COILS

(71) Applicant: Albert-Ludwigs-Universitaet Freiburg, Freiburg (DE)

(72) Inventors: Huijun Yu, Freiburg (DE); Sebastian Littin, Freiburg (DE); Maxim Zaitsev, Freiburg (DE)

(73) Assignee: Albert-Ludwigs-Universität Freiburg, Freiburg (DE)

( * ) Notice: Subject to any disclaimer, the term of this patent is extended or adjusted under 35 U.S.C. 154(b) by 592 days.

(21) Appl. No.: 14/613,396

(22) Filed: Feb. 4, 2015

(65) Prior Publication Data
US 2015/0234021 A1 Aug. 20, 2015

(30) Foreign Application Priority Data
Feb. 19, 2014 (EP) ..................................... 14155823

(51) Int. Cl.
*G01R 33/385* (2006.01)
*G01R 33/54* (2006.01)

(52) U.S. Cl.
CPC ....... *G01R 33/3852* (2013.01); *G01R 33/543* (2013.01)

(58) Field of Classification Search
CPC .......................... G01R 33/3852; G01R 33/543
See application file for complete search history.

(56) References Cited

U.S. PATENT DOCUMENTS

| | | | | | |
|---|---|---|---|---|---|
| 4,628,264 | A | * | 12/1986 | Rzedzian | G01R 33/3852 324/307 |
| 4,864,479 | A | * | 9/1989 | Steigerwald | H02M 3/337 363/132 |
| 5,311,135 | A | * | 5/1994 | Vavrek | G01R 33/385 324/318 |

(Continued)

FOREIGN PATENT DOCUMENTS

WO   WO 2009/124873   10/2009

OTHER PUBLICATIONS

"Solid-state relay—Wikipedia", Wikipedia, Feb. 8, 2014, URL:https://www.wikipedia.org/w/index.php?title=Solid-state_relay&oldid=594584130 [retrieved on Mar. 9, 2017].

(Continued)

*Primary Examiner* — G. M. Hyder
(74) *Attorney, Agent, or Firm* — Paul Vincent

(57) ABSTRACT

A multi-channel switching system (100) for an MRI gradient coil system is characterized in that the number of channels controlled by the power amplifiers is smaller than the number of switches and the number of channels controlled by the power amplifiers is smaller than the number of coil elements in the coil system. Current in each of the coil elements can be switched to flow in either a positive or negative direction or to bypass the respective coil element and power to the switch elements is delivered via a smaller amount of power lines using a power distribution system providing floating power to each of the switches. This allows to electrically connect matrix coil elements dynamically within a pulse sequence to generate dynamically switched magnetic field profiles and therefore reduce the number of gradient power amplifiers, gradient cables and power supplies needed.

12 Claims, 4 Drawing Sheets

(56) References Cited

U.S. PATENT DOCUMENTS

| | | | | |
|---|---|---|---|---|
| 5,311,136 A | * | 5/1994 | Takahashi | G01R 33/3852 324/318 |
| 5,663,647 A | * | 9/1997 | Wirth | G01R 33/3852 324/322 |
| 5,909,120 A | * | 6/1999 | Mori | G01R 33/3852 324/318 |
| 6,031,746 A | * | 2/2000 | Steigerwald | H03F 3/2171 323/225 |
| 6,157,280 A | * | 12/2000 | Arz | G01R 33/385 324/320 |
| 6,297,635 B1 | * | 10/2001 | Arz | G01R 33/385 324/318 |
| 6,545,473 B1 | * | 4/2003 | Gebhardt | G01R 33/385 324/318 |
| 7,411,395 B2 | | 8/2008 | Hennig | |
| 2005/0275404 A1 | * | 12/2005 | Sabate | G01R 33/3852 324/322 |
| 2012/0007571 A1 | * | 1/2012 | Huisman | G01R 33/3852 323/271 |
| 2012/0249145 A1 | * | 10/2012 | Lai | G01R 33/3852 324/318 |
| 2012/0262171 A1 | | 10/2012 | Weber | |
| 2012/0286783 A1 | | 11/2012 | Constable | |

OTHER PUBLICATIONS

"Bootstrapping (electronics)—Wikipedia", Wikipedia, Dec. 28, 2013, URL:http://en.wikipedia.org/w/index.php?title=Bootstrapping_(electronics)&oldid=588069218 [retrieved on Mar. 7, 2017].

C. T. Harris et al., "A New Approach to Shimming: The Dynamically Controlled Adaptive Current Network", Magnetic Resonance in Medicine 71:859-869, (2014).

P.C. Lauterbur, "Image Formation by Induced Local Interactions: Examples Employing Nuclear Magnetic Resonance", Nature vol. 242, Mar. 16, 1973.

Christoph Juchem et al., "Magnetic Field Homogenization of the Human Prefrontal Cortex With a Set of Localized Electrical Coils", Magnetic Resonance in Medicine 63:171-180, (2010).

"Dual Bootstrapped, 12 V MOSFET with Output Disable", Semiconductor Components Industries, LLC, 2008, Aug. 2008—Rev. 4.

* cited by examiner

MULTI-CHANNEL SWITCHING SYSTEM FOR MRI MATRIX GRADIENT COILS

This application claims Paris convention priority from EP 14 155 823.9 filed Feb. 19, 2014, the entire disclosure of which is hereby incorporated by reference.

BACKGROUND OF THE INVENTION

The invention relates to a multi-channel switching system for a multi-channel gradient coil system for MRI (=Magnetic Resonance Imaging), comprising: a plurality of $N_{switch}$ analog switches to connect a plurality of $N_{element}$ coil elements, whereby said plurality of analog switches and coil elements forms a plurality of $N_{channel}$ electrical channels each driven by a gradient power amplifier; a distribution board to generate control signals for each of the plurality of analog switches; a digital controller providing the command code to the distribution board through a communication bus; and a power delivery system to power each of $N_{switch}$ analog switches.

A multi-channel switching system of this type for shimming is known e.g. from Harris et al., "A new approach to shimming: the dynamically controlled adaptive current network", MRM 71: 859-869, 2014. Such systems, however, require individual power supplies for each switch, which limits the scalability.

The present invention relates generally to magnetic resonance imaging (MRI). It specifically relates to shimming and spatial encoding hardware for MRI.

Magnetic resonance imaging (MRI) is a relative new technology compared with computed tomography (CT) and the first MR Image was published in 1973 by P. C. Lauterbur in "Image Formation by Induced Local Interactions: Examples of Employing Nuclear Magnetic Resonance", Nature 242, 190491. It is primarily a medical imaging technique which most commonly used in radiology to visualize the structure and function of the body. It could provide detailed Images of the body in any plane. MRI provides much greater contrast between the different soft tissues of the body than CT does, making it especially useful in neurological, cardiovascular, and oncological imaging. It uses a powerful magnetic field to align the nuclear magnetization of hydrogen atoms in water in the body. Radio frequency fields are used to systematically alter the alignment of this magnetization, causing the hydrogen nuclei to produce a rotating magnetic field detectable by the scanner. This signal can be manipulated by additional magnetic fields to build up enough information to reconstruct an image of the body.

An MRI system typically establishes a homogenous magnetic field, generally along a central axis of a subject undergoing an MRI procedure. This homogenous main magnetic field affects the magnetic properties of the subject to be imaged by aligning the nuclear spins, in atoms and molecules forming the body tissue. If the orientation of the nuclear spins is perturbed out of alignment, the nuclei attempt to realign their spins with the field. Perturbation of the orientation of the nuclear spins is typically caused by application of radio frequency (RF) pulses tuned to the Larmor frequency of the material of interest. During the realignment process, the nuclei precess about the direction of the main magnetic field and emit electromagnetic signals that may be detected by one or more RF detector coils placed on or around the subject.

Magnetic resonance imaging employs temporally and spatially variable magnetic fields to encode position by affecting the local Larmor frequency of spins. Gradient coils typically used for that purpose generate spatial encoding magnetic fields (=SEMs) which are superimposed on the main magnetic field. This allows to choose the localization of the image slices and also to provide phase encoding and frequency encoding. This encoding permits identification of the origin of resonance signals during image reconstruction. The image quality and resolution depends significantly on the strength and how the applied encoding fields can be controlled. Control of the gradient coils is generally performed in accordance with pre-established protocols or sequences at events, called pulse sequences, permitting different types of contrast mechanisms to be imaged.

Gradient coils are typically designed to generate spatial encoding magnetic fields in a linear fashion, i.e. constant linear gradient fields, along the three orthogonal directions X, Y and Z. Typically, a gradient coil operates with maximum currents of about few hundreds amperes and at maximum voltages in a range from about few hundreds volts to about few thousands volts. To achieve higher resolution of an image, stronger and faster gradient fields are needed. Therefore gradient coils need higher currents and voltages. However, this induces safety concerns due to peripheral nerve stimulation (=PNS) and increases the complexity and cost of the current sources which are referred to as gradient power amplifiers. Another drawback of linear gradients is the missing flexibility in terms of realizable field shapes.

To overcome these limitations non-linearly varying SEMs have been introduced by EP 1 780 556 B1. Such gradient fields may overcome PNS limits and allow for parallel non-bijective image encoding or curved slice imaging (see e.g. EP 2 511 725 A1). For faster image acquisition more encoding fields than spatial dimensions (X, Y and Z) have been used (for example 4D-Rio, O-Space, see e.g. US 2012/0 286 783 A1). Multi element coil systems have been used to generate the SEMs needed for those applications. However, such systems still have a limited set of field shapes and need a dedicated gradient power amplifier per coil element.

Susceptibility differences in the object to be imaged introduce field perturbations of the homogeneous main magnetic. Compensation of these perturbations is commonly referred to as shimming. Shim coils used for these corrections usually aim to generate shim fields that are based on spherical volume harmonics. However, complex susceptibility differences present in the human body introduce perturbations that cannot be fully corrected for by spherical volume harmonics of lower orders. To overcome these limitations a set of multiple self-similar individual coil elements, each supplied by a separate current source has been introduced (by Christoph Juchem et al in "Magnetic field homogenization of the human prefrontal cortex with a set of localized electrical coils", MRM 63:171-180, 2010). Although this approach gains flexibility in terms of realizable field shapes used for shimming, the number of individual current sources scales linearly with the number of coils. This increases cost and space needed. To significantly reduce the number of amplifiers while allowing to route currents along pre calculated paths a Dynamically Controlled Adaptive Current Network has been introduced (see Chad. T. Harris et al. in "A new approach to shimming: the dynamically controlled adaptive current network", MRM 71: 859-869, 2014).

The use of a multiple of individual coil elements to generate SEMs has been introduced for example in WO 2009/124873 A1. This allows for enhanced flexibility in terms of realizable field profiles of the SEMs. However, as with the set of localized electrical coils used for shimming the number of GPAs and the corresponding connection cables equals the number of individual coil elements.

Switches to route currents in gradient setups have been presented in U.S. Pat. No. 6,157,280. However, the proposed switching method is either too slow to be changed within a pulse sequence (fluid actuated switch) or does not teach us on how the scaling constraint of requiring a separate power supply for each switch can be overcome. Furthermore, this patent did not describe a way of generating different field shapes with the same coil set up.

The present invention presents a way to substantially overcome one or more disadvantages of the existing arrangements.

An object of the present invention therefore is to provide a multi-channel switching system with the features defined initially, which allows to electrically connect matrix coil elements dynamically within a pulse sequence to generate dynamically switched magnetic field profiles, and therefore reduce the number of gradient power amplifiers, gradient cables and power supplies needed.

SUMMARY OF THE INVENTION

This object is achieved by modifying such multi-channel switching system in that the number $N_{channel}$ of channels controlled by the gradient power amplifiers is smaller than the number $N_{switch}$ of analog switches $N_{channel} < N_{switch}$, whereby the said switches (106) are connected in series, in parallel or in a bridge configuration, that the number $N_{channel}$ of channels controlled by the gradient power amplifiers is smaller than the number $N_{element}$ of coil elements in the multi-channel gradient coil system $N_{channel} < N_{element}$, whereby current in every of the said coil elements can be switched to flow in either positive or negative direction or to bypass the respective coil element, and that the power to the plurality of $N_{switch}$ elements is delivered via a smaller amount of $N_{power}$ power lines, where $N_{power}$ is equal to 2, such that $N_{power} < N_{switch}$ by means of a power distribution system providing power to each of the said switches.

The present invention proposes that a multi-channel switching system for a multi-channel gradient coil system for Magnetic Resonance Imaging (MRI) and includes a plurality of analog switches, a plurality of individual coil elements, a digital controller and a distribution board. The proposed system is used to configure different combinations of gradient coil elements during pulse sequences for magnetic resonance imaging and shimming applications. A common power delivery system provides power to each analog switch.

The switch system according to the present invention is particularly advantageous in a combination with a matrix gradient or shim coil. A plurality of coil elements forms a matrix coil wherein one or several sets of coil elements have the property of self-similarity. A plurality of analog switches allows connecting coil elements into channels which are controlled by a lower number of gradient power amplifiers (=GPAs). Aforementioned coil elements can be configured such that current flows in either positive or negative direction or can bypass selected elements. This allows for the generation of customized SEMs and for shim fields for MRI.

The distribution board and analog switches are placed inside or close to the multi-channel gradient coil such that they are exposed to the main magnetic field thus reducing the number and length of connecting wires. Therefore a multiple of coil elements can be driven by a single amplifier and the total number of gradient amplifiers as well as feed through filters into the RF-shielded room can be made much smaller than the number of coil elements. The analog switches can handle high currents and can be switched at any time following a digital command.

In preferred embodiments of the present invention, coil setting for individual channel combinations are sent via a digital interface from a computer to the digital controller ahead of experiment. The digital controller loads these parameters onto the distribution board via a digital bus system, preferably using an optical link. After download, the distribution board applies the code settings to the individual analog switches. The communication interface between digital controller and distribution board consists of data and clock connection. The number of analog switches depends on the number of coil elements and the required switching scheme.

In a further embodiment of the invention, the distribution board directly produces control signals to control the metal-oxide-semiconductor field-effect transistors (MOSFETs) or insulated-gate bipolar transistors (IGBTs) or integrated gate-commutated thyristors (IGCTs) following the coil setting command.

In a further embodiment of the invention, a bootstrap based driver circuit is used to drive a MOSFET or IGBT or IGCT. A timer circuit in combination with a negative voltage referenced current regulator charges the bootstrap capacitor periodically and generates the power for the floating driver.

In another embodiment of the invention, a bipolar current regulator is used which has the advantages that they are compatible with bipolar GPAs and no current is injected into the driven SEM or shim system.

In a further embodiment of the invention, the power supplying the electrical switching circuit is provided using an optical power delivery system comprising one or multiple light sources, a fiber optical transmission and distribution system and a plurality of light to electricity transducers.

In a preferred embodiment, the multi-channel switching system according to the present invention is designed to operate with a matrix coil comprising of one or several sets of self-similar coil elements. Therefore different magnetic field profiles can be generated by configuring the combination of the coil matrix. The matrix coil configured this way can be controlled by a low number of GPAs.

In a further preferred embodiment, each of the plurality of analog switches is positioned in the immediate vicinity of the multi-channel gradient coil system and is exposed to the main magnetic field of an MRI system. Placing switches close to or into the main magnetic field allows for avoiding extra cables to connect or bypass each coil element. The length of connection wires between the respective element and the switching system can be reduced, which diminishes power losses and allows for faster switching due to lower inductivity.

It is further advantageous to position the distribution board in the immediate vicinity of the multi-channel gradient coil system and let it be exposed to the main magnetic field of an MRI system. The length of the connections to control each analog coil switch is reduced compared to placing the distribution board further away. If this board is placed outside the magnet room one feed through filter per switch has to be installed. In this way, the length of connecting wires of the control signals is reduced to improve the reliability of the system and to simplify RF shielding.

In another embodiment of the invention, each of the plurality of analog switches is capable to dynamically control the combination of the matrix gradient coil elements during MR pulse sequences, in particular on a time scale of the lifetime of the MR signal, that is 1 to 100 ms. The dynamic re-configuration of the encoding fields allow for more flexible encoding strategies. Changing the configuration and therefore switching in between a pulse sequence allows for more realizable field shapes and for more freedom, e.g. for dynamic shimming (i.e. changing the shim field during a pulse sequence).

Above said embodiment of the invention can be further improved, when a plurality of analog switches is capable to change its state whenever no current is flowing through the respective switch. This allows to reduce switching losses in the analog switches and guarantee that the current waveform provided by the GPA will not be distorted by the analog switches. In some case it might be even impossible to realize the change of the state of the switches while high current are present.

In another preferred embodiment of the invention, each of the plurality of analog switches is provided with sufficient power using the power delivery system for the period of an arbitrary MR pulse sequence. This is very essential for practical imaging applications and allows for continuous measurements without timing limits. Without such a system, there are hard timing limits for a pulse sequence.

Also preferred is an embodiment of the invention, wherein each of the plurality of analog switches is powered by one or a plurality of power supplies using a periodic rechargeable bootstrap circuit providing floating power for each of the plurality of analog switches. The advantage of the bootstrapping circuit is that it provides a continuous floating power to the switches, while maintaining a sufficient isolation between them. This is a practical solution for the above mentioned timing limits. The circuit to generate floating power allows for reducing the minimum number of required power supplies to at least one. Without this feature, one power supply is required for each of the analog switches.

In a further embodiment of the invention, each of the plurality of analog switches is powered by an optical power delivery system comprising a light source and a plurality of light-to-electricity convertors to provide floating power for each of the plurality of analog switches. Such a setup allows for a power delivery with a reduced risk of RF interference and improved isolation between the switches. This is another solution to supply floating power. The possibility for RF-interferences is reduced as well, if less conductive paths get into the magnet room.

Further preferred is an embodiment of the multi-channel switching system according to the present invention which is designed suitable for spatial encoding. Spatial encoding using such a system is possible if high currents can be switched.

This allows for novel nonlinear encoding strategies, e.g. extensions of PatLoc encoding. It is to be noted, that imaging applications require operation modes with high currents and voltages applied to the multi-channel gradient coil system, which puts stringent requirements on the isolation between the switches and their power supplies.

Another preferred embodiment of the invention is the multi-channel system being designed suitable for magnetic field shimming. Better accuracy of shim fields can be achieved compared to high order spherical harmonic shimming (typically $2^{nd}$ or incomplete $3^{rd}$ order on human-size systems), while reducing the number of shim amplifiers needed. This further has a potential for a combination with the encoding system making dedicated shim coils redundant.

In yet another preferred embodiment of the invention, the switch is realized by either metal-oxide-semiconductor MOSFETs (=field-effect transistors or IGBTs (=insulated-gate bipolar transistors) or IGCTs (=integrated gate-commutated thyristors). Such devices allow higher switching speed then mechanical or fluid or pneumatically actuated switches known previously.

It can be further advantageous if the entire system for imaging or shimming is connected to a single power amplifier. This reduces cost and space needed for additional amplifiers and simplifies the system architecture.

These, as well as other objects and advantages of this invention can be better understood and appreciated through careful study of the following detailed description of presently preferred exemplary embodiments of this invention in conjunction with the accompanying drawing.

DESCRIPTION OF THE PREFERRED EMBODIMENT

A multi-channel switching system for a multi-channel gradient coil system for Magnetic Resonance Imaging (MRI) is proposed. An embodiment of a switching system includes a plurality of analog switches, distribution board, digital controller and a power delivery system for each switch. The plurality of analog switches is placed in the immediate vicinity of coil elements inside or close to the magnet bore. The distribution board is also located inside or close to the magnet bore. The switching system is used to control a combination of matrix coil elements, such that many coil elements can be driven by a lower number of amplifiers than coil elements and the total number of gradient amplifiers required to drive a matrix gradient coil can be reduced.

Figure 1:
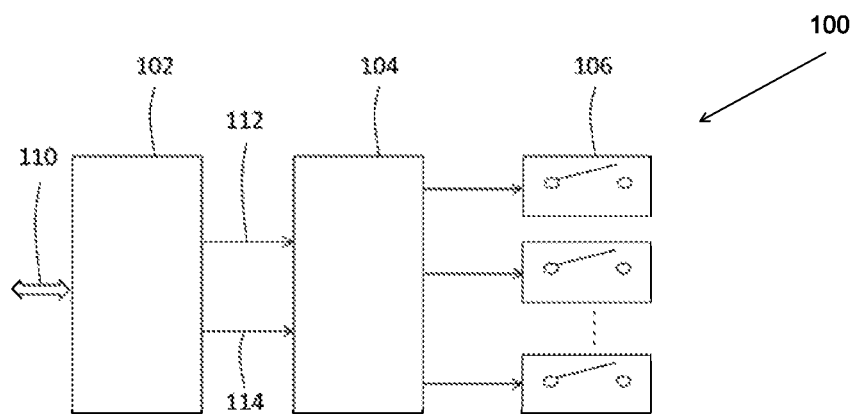
FIG. 1 shows a block diagram of a multi-channel switching system, in accordance with aspects of the presented technique.

Referring to FIG. 1, a block illustration of an exemplary multi-channel switching system 100 for use in a matrix gradient coil system for MRI, in accordance with aspects of the presented technique, is depicted. The multi-channel switching system 100 is illustrated, including a digital controller 102, a distribution board 104, a plurality of analog switches 106. The function of each component will be described in greater detail with reference to FIGS. 1-6. The digital controller 102 is used to define a combination of matrix coil elements. The distribution board 104 is used to provide control signals to a plurality of analog switches 106. The plurality of analog switches 106 is used to configure the combination of matrix gradient coil elements and deliver high current gradient waveforms to matrix gradient coil elements, following a command of digital controller 102.

In the embodiment illustrated in FIG. 1, the digital controller 102 receives data via communication bus 110. The data through communication bus 110 may be received from an external source, such as a computer (not shown in FIG. 1). Data received from communication bus 110 are employed to generate the gated clock 112 and the serial data stream 114 to distribution board 104. Thereafter, the gated clock 112 and serial data 114 are used to send the command signal to distribution board 104 and control the work modes of each of the plurality of analog switches 106.

Figure 2:
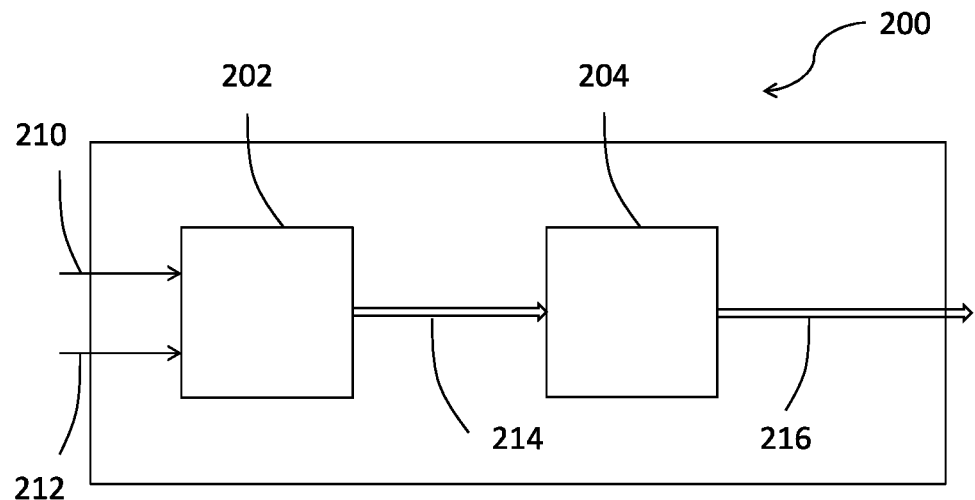
FIG. 2 shows a block diagram of an exemplary distribution board of the multi-channel switching system of FIG. 1, in accordance with aspects of the presented technique.

FIG. 2 is a block diagram of one embodiment 200 of the exemplary distribution board. The distribution board 200 is implemented by a complex programmable logic device (CPLD) or by a field programmable gate array (FPGA). The distribution board 200 includes decoder 202 and command generator 204. Decoder 202 receives the clock 210 and serial data 212 from digital controller 102, decodes this data and generates command data 214. Command generator 204 generates control signal 216 to control the plurality of analog switch 106. Two optical fiber cables may be used to avoid noise interference to transmit clock 210 and serial data 212. Clock 210 may be activated only at the communication period to minimize the induced radio frequency noise during the MR signal acquisition periods.

Figure 3:
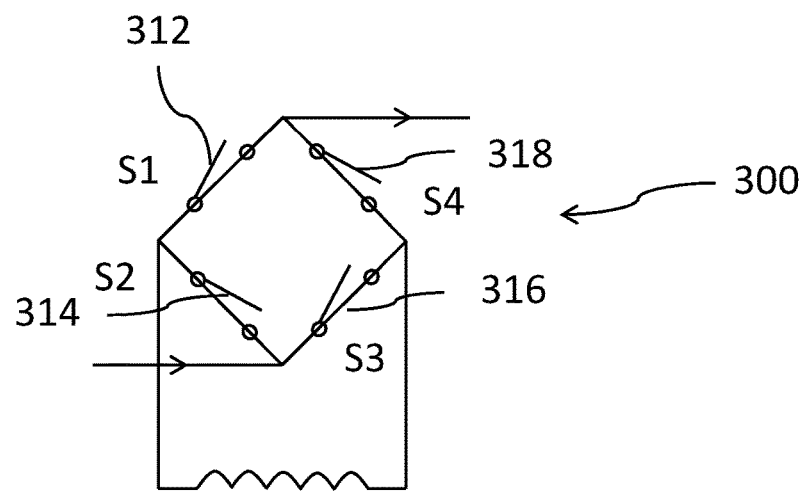
FIG. 3 shows a diagrammatical illustration of an exemplary analog switch of the multi-channel switching system of FIG. 1, in accordance with aspects of the presented technique.

FIG. 3 is a schematic representation of one embodiment 300 of analog switch 106 in FIG. 1 connected to a matrix coil element. In the presently contemplated configuration, the embodiment 300 of analog switch 106 as a bridged switch includes four switches S1 (312), S2 (314), S3 (316) and S4 (318), where the bridges are connected in series. The analog switch 300 may work in three different modes. One mode called positive current mode is used to control switches S2 (314) and S4 (318) in on-state and switches S1 (312) and S3 (316) in off-state; one mode called negative current mode is used to control switches S3 (316) and S1 (312) in on-state, and switches S2 (314) and S4 (318) in off-state; the last mode called bypass mode may be used to control switches S3 (316) and S4 (318) in on-state and switches S1 (312) and S2 (314) in off-state, or to control switches S2 (314) and S1 (312) in on-state and switches S3 (316) and S4 (318) in off-state. There are three different corresponding modes to control current waveforms through the coil element.

Figure 4:
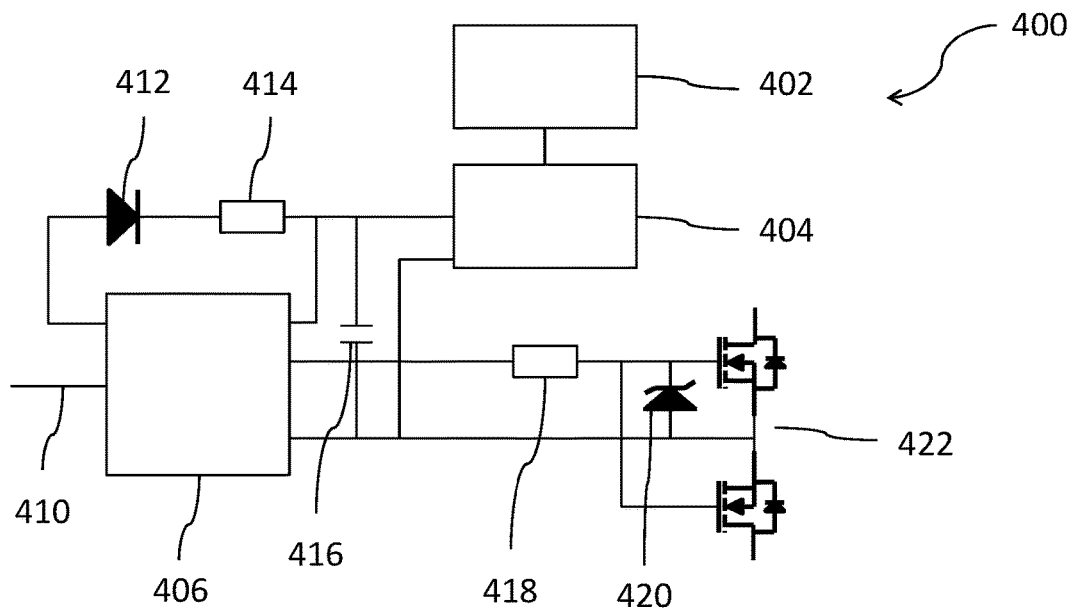
FIG. 4 shows a diagrammatical illustration of an exemplary analog switch element of FIG. 3, in accordance with aspects of the presented technique.

Referring to FIG. 4, a diagrammatical representation 400 of one embodiment of one analog switch element of the analog switch 106 of FIG. 1 is depicted. In a presently contemplated configuration, the analog switch element 400 includes a current regulator 402, a timer 404, a high side driver 406, a bootstrap diode 412, a current limiting resistor 414, a bootstrap capacitor 416, a current limiting resistor 418, a Zener diode 420 and two power MOSFETs 422. The high side driver 406 receives control signal 410 at the input terminal to control the "on" and "off" states of two MOSFETs 422. A bootstrap circuit is used to supply the current as a substitute for an isolated supply. The bootstrap circuit consists of bootstrap diode 412, bootstrap capacitor 416 and current limiting resistor 414. The bootstrap capacitor 416 supplies the gate charge when two MOSFETs 422 are turned on. Since a capacitor is used as substitute for an isolated power supply, its supply capability is limited. For the given component parameter a maximal duration of the reliable supply $T_{max}$ can be calculated and measured. The timer 404 in combination with the current regulator 402 charges the bootstrap capacitor 416 periodically with a period $T_p<T_{max}$ and provides the power supply for the output of high side driver 406. Therefore the analog switch element 400 may be accurately controlled during an indefinite period of time. The current regulator 402 may provide bipolar current. A current limiting resistor 418 may be used between high side driver 406 and two MOSFETs 422. A Zener diode 420 may be used to protect the two MOSFETs 422 under overvoltage condition. It is also possible to use the optical power delivery system to replace the bootstrap circuit based power delivery system.

Figure 5:
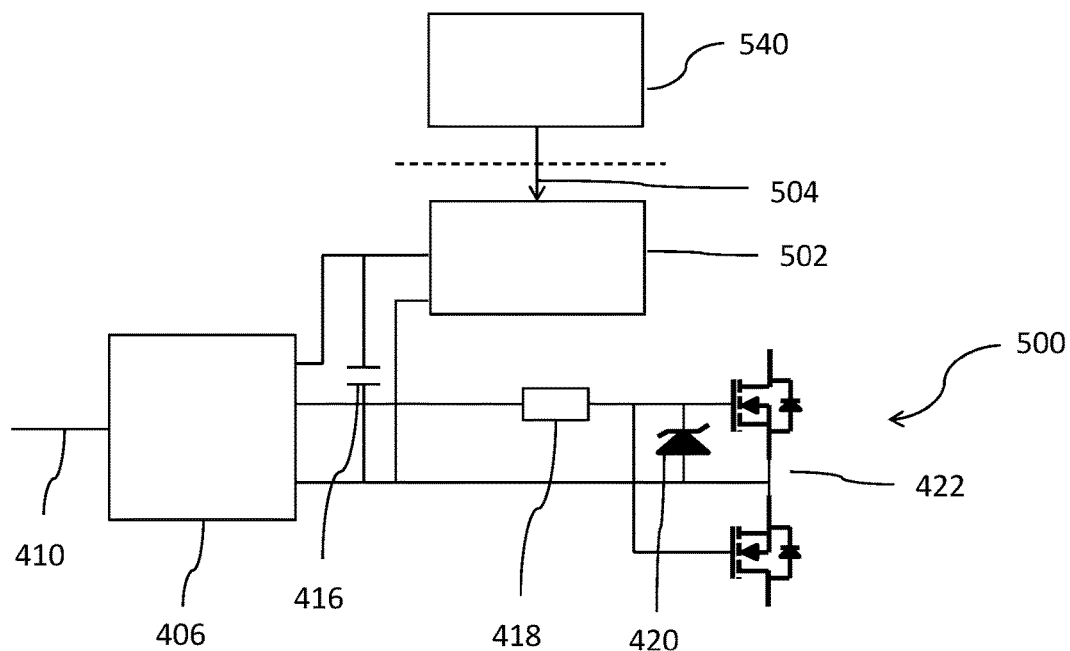
FIG. 5 shows a diagrammatical illustration of an alternative exemplary analog switch element of FIG. 3, in accordance with aspects of the presented technique.

Another embodiment 500 of one analog switch element of the analog switch 106 is shown in FIG. 5. The laser transmitter 540 transmit high power light into the optical fiber 504, then photovoltaic power receiver 502 converts the laser light into electrical power to supply the floating power. Other parts are the same as shown in embodiment 400 of FIG. 4.

Figure 6:
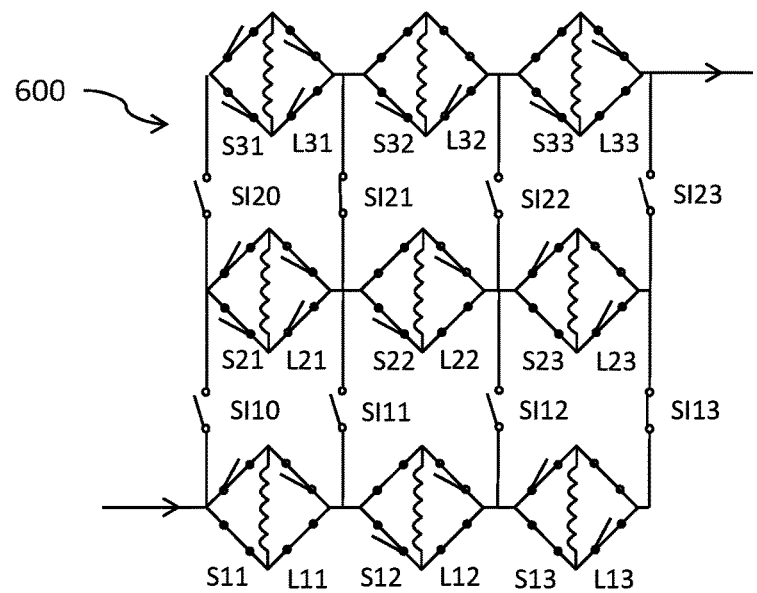
FIG. 6 shows a diagrammatical illustration of analog switches of FIG. 3 interconnects with matrix coil elements are in accordance with aspects of the presented technique.

FIG. 6 is a diagrammatical representation 600 of one exemplary embodiment of a plurality of analog switches (shown in FIG. 3) which interconnects matrix coil elements. FIG. 6 shows how to connect in serial and in parallel between nine (3*3) coil elements and nine (3*3) analog switches 300 in bridge configuration (see FIG. 3) and eight (2*4) additional single switches, where S11, S12, S13, S21, S22, S23, S31, S32 and S33 are analog bridge switches, where SI10, SI11, SI12, SI13, SI20, SI21, SI22 and SI23 are analog interconnect switches, where L11, L12, L13, L21, L22, L23, L31, L32 and L33 are coil elements. This embodiment is particularly flexible and may achieve many different current flow patterns through the matrix coil.

Figure 7:
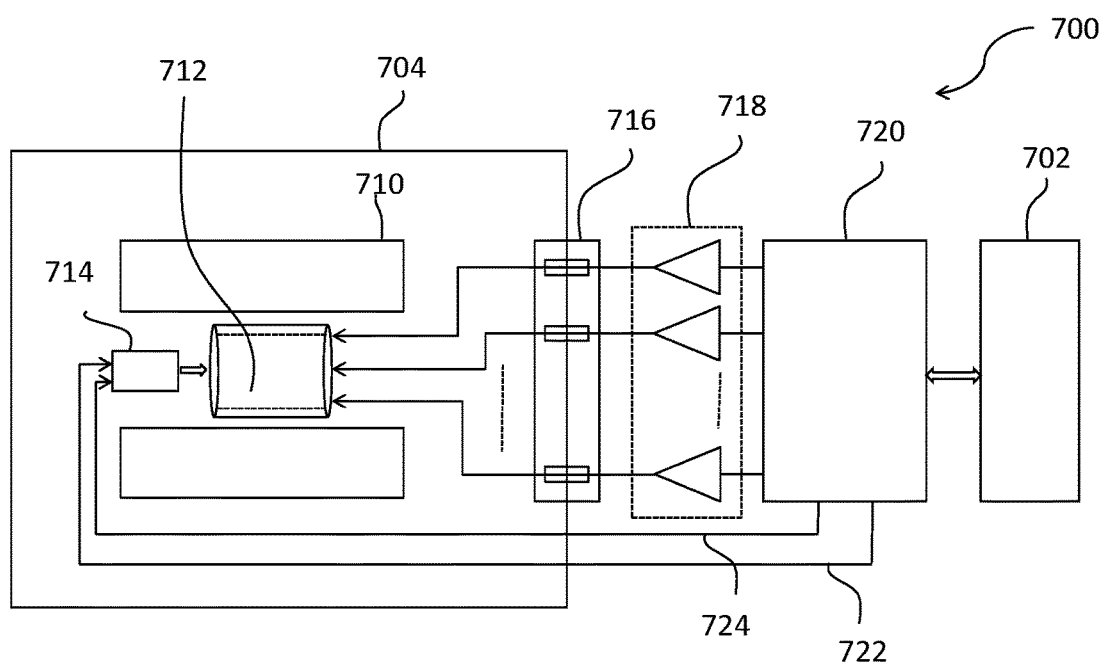
FIG. 7 shows a block diagram illustrating a gradient system of a magnetic resonance imaging system employing the multi-channel switching system of FIG. 1, in accordance with aspects of the presented technique.

FIG. 7 is a block diagram 700 illustrating a gradient system for MRI that includes the exemplary multi-channel switching system 100 (see FIG. 1), in accordance with aspects of the present technique. The gradient system for MRI 700 is illustrated diagrammatically, including digital controller 720, gradient amplifiers 718, filters 716, matrix gradient coils 712, multi-channel switches 714 and Computer 702. MRI bore magnet 710 is placed in a separate RF shielded room 704. The matrix coils 712 are positioned in the center of magnet bore. The multi-channel switches 714 are placed in the immediate vicinity of the matrix coil elements inside or close to the magnet bore. The corresponding MR-scanner may be of any suitable type of field strength, including scanners varying from 0.5 Tesla to 7 Tesla and beyond.

The matrix coils 712 include conductive wires, bars or plates that are wound or cut to form a coil structure that generates a gradient filed superimposed over the primary magnetic field. The matrix coils 712 in combination with multi-channel switches 714 may form many different configurations to generate desired nonlinear or linear fields for imaging or shimming. The configuration of matrix coils 712 may be dynamically adapted during pulse sequences. The matrix coils 712 are driven by gradient power amplifiers 718 to obtain precisely controlled magnetic field amplitudes. The field strength may vary over a predefined field of view, typically with positive and negative polarity. RF filters 716 are located between gradient amplifiers 718 and matrix coils 712 to eliminate interference noise from outside the shielded room 704. The matrix coils 712 are controlled by digital controller 720 to generate the desired magnetic field. The predefined current waveforms and all command information are downloaded from PC 702. As one embodiment shown, the command of multi-channel switches 714 is supplied by the digital controller 720. The command signal includes clock 724 and serial data 722. The communication may be implemented by optical fiber connections to eliminate interference noise or safety concerns due to increased voltages.

The methods and systems described hereinabove aid in dynamically generating the desired magnetic field in a gradient system. The dynamically adapted magnetic field is implemented by multi-channel switches to control different configuration of matrix coil elements during pulse sequences. Therefore, many coil elements are driven by a single gradient amplifier. The total number of gradient amplifiers can be dramatically reduced for matrix coil configuration.

While only certain features of the invention have been illustrated and described herein, many modifications and changes will occur to those skilled in the art. It is, therefore, to be understood that the appended claims are intended to cover all such modifications and changes as fall within the true spirit of the invention.

We claim:

1. A multi-channel switching system for a multichannel gradient coil system for MRI (=Magnetic Resonance Imaging), the switching system comprising:
   a plurality of analog switches to connect a plurality of gradient coil elements, said plurality of analog switches and said plurality of gradient coil elements forming a plurality of electrical channels to generate dynamically switched current paths, each driven by a gradient power amplifier;
   a distribution board to generate control signals for each of the plurality of analog switches, wherein said distribution board is positioned in an immediate vicinity of the multi-channel gradient coil system and is exposed to a main magnetic field of an MRI system;
   a digital controller providing a command code to said distribution board through a serial data line accompanied with a gated clock using optical fiber; and
   a power delivery system to power each of said plurality of analog switches, wherein a number $N_{channel}$ of said electrical channels controlled by said gradient power amplifiers is smaller than a number $N_{switch}$ of said analog switches $N_{channel} < N_{switch}$, said analog switches being connected in series, in parallel or in a bridge configuration and said number $N_{channel}$ of electrical channels controlled by said gradient power amplifiers being smaller than a number $N_{element}$ of said coil elements in the multichannel gradient coil system $N_{channel} < N_{element}$, wherein the switching system is structured such that current in each of said coil elements can be switched to flow in a positive direction, in a negative direction or to bypass a respective coil element, wherein said power delivery system provides power to each of said analog switches.

2. The multi-channel switching system of claim 1, wherein the system is designed to operate with a matrix coil comprising of one or several sets of self-similar coil elements.

3. The multi-channel switching system of claim 1, wherein each of said plurality of analog switches is positioned in an immediate vicinity of the multi-channel gradient coil system and is exposed to the main magnetic field of an MRI system.

4. The multi-channel switching system of claim 1, wherein each of said plurality of analog switches is structured to dynamically control a combination of matrix gradient coil elements during MR pulse sequences.

5. The multi-channel switching system of claim 1, wherein each of said plurality of analog switches is structured to change a state whenever no current is flowing through a respective switch.

6. The multi-channel switching system of claim 1, wherein each of said plurality of analog switches is provided with sufficient power using said power delivery system for a period of an arbitrary MR pulse sequence.

7. The multi-channel switching system of claim 1, wherein each of said plurality of analog switches is powered by said power delivery system using a periodic rechargeable bootstrap circuit providing local continuous floating power for each of said plurality of analog switches.

8. The multi-channel switching system of claim 1, wherein each of said plurality of analog switches is powered by an optical power delivery system comprising an optical fiber light source, at least one optical fiber and a plurality of light-to-electricity converters.

9. The multi-channel switching system of claim 1, wherein the system is designed for spatial encoding.

10. The multi-channel switching system of claim 1, wherein the system is designed for simultaneous spatial encoding and shimming.

11. The multi-channel switching system of claim 1, wherein said analog switch comprises a metal-oxide-semiconductor MOSFET (=field-effect transistor), or a IGBT (=insulated-gate bipolar transistor) or a IGCT (=integrated gate-commutated thyristor).

12. The multi-channel switching system of claim 1, wherein an entire system for imaging or shimming is connected to a single gradient power amplifier.

* * * * *